United States Patent
Oshita et al.

(10) Patent No.: US 11,365,571 B2
(45) Date of Patent: Jun. 21, 2022

(54) OPERATION INPUT DEVICE AND DOOR HANDLE

(71) Applicant: ALPS ALPINE CO., LTD., Tokyo (JP)

(72) Inventors: Kazuhito Oshita, Miyagi (JP); Daisuke Takai, Miyagi (JP); Toshiki Nakamura, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 302 days.

(21) Appl. No.: 16/789,770

(22) Filed: Feb. 13, 2020

(65) Prior Publication Data

US 2020/0181953 A1 Jun. 11, 2020

Related U.S. Application Data

(63) Continuation of application No. PCT/JP2018/027649, filed on Jul. 24, 2018.

(30) Foreign Application Priority Data

Sep. 29, 2017 (JP) .............................. JP2017-191202

(51) Int. Cl.
  *E05B 81/76* (2014.01)
  *G06F 3/044* (2006.01)
(52) U.S. Cl.
  CPC .............. *E05B 81/76* (2013.01); *E05B 81/77* (2013.01); *G06F 3/0443* (2019.05); *E05Y 2400/854* (2013.01); *E05Y 2400/86* (2013.01)
(58) Field of Classification Search
  None
  See application file for complete search history.

(56) References Cited

U.S. PATENT DOCUMENTS

| | | | |
|---|---|---|---|
| 2016/0138941 A1* | 5/2016 | Hirota | H03K 17/962 340/5.2 |
| 2017/0235391 A1 | 8/2017 | Ishikawa et al. | |
| 2019/0010749 A1* | 1/2019 | Sugiura | E05F 15/73 |

FOREIGN PATENT DOCUMENTS

| JP | 10-308148 | 11/1998 |
|---|---|---|
| JP | 2008-004465 | 1/2008 |

(Continued)

OTHER PUBLICATIONS

International Search Report for PCT/JP2018/027649 dated Oct. 23, 2018.

*Primary Examiner* — Duane N Taylor, Jr.
(74) *Attorney, Agent, or Firm* — IPUSA, PLLC

(57) ABSTRACT

An operation input device includes a substrate formed of an insulator, a plurality of detecting electrodes provided on a surface of the substrate, and a controller, wherein the controller detects capacitance generated between each of the detecting electrodes and an operation body when the operation body is positioned in proximity to the substrate, and determines that a gesture operation by the operation body is performed when a duration from when the capacitance becomes a first threshold or greater to when the capacitance becomes a second threshold or greater is a predetermined value or greater, or when a length in which the operation body is moved from when the capacitance becomes the first threshold or greater to when the capacitance becomes the second threshold or greater is a predetermined value or greater, the first threshold being a threshold for the capacitance, and the second threshold being greater than the first threshold.

17 Claims, 17 Drawing Sheets

(56) References Cited

FOREIGN PATENT DOCUMENTS

| JP | 2009-079353 | 4/2009 |
| JP | 2010-235035 | 10/2010 |
| JP | 2015-133206 | 7/2015 |
| JP | 2017-147084 | 8/2017 |
| WO | 2015/104752 | 7/2015 |

* cited by examiner

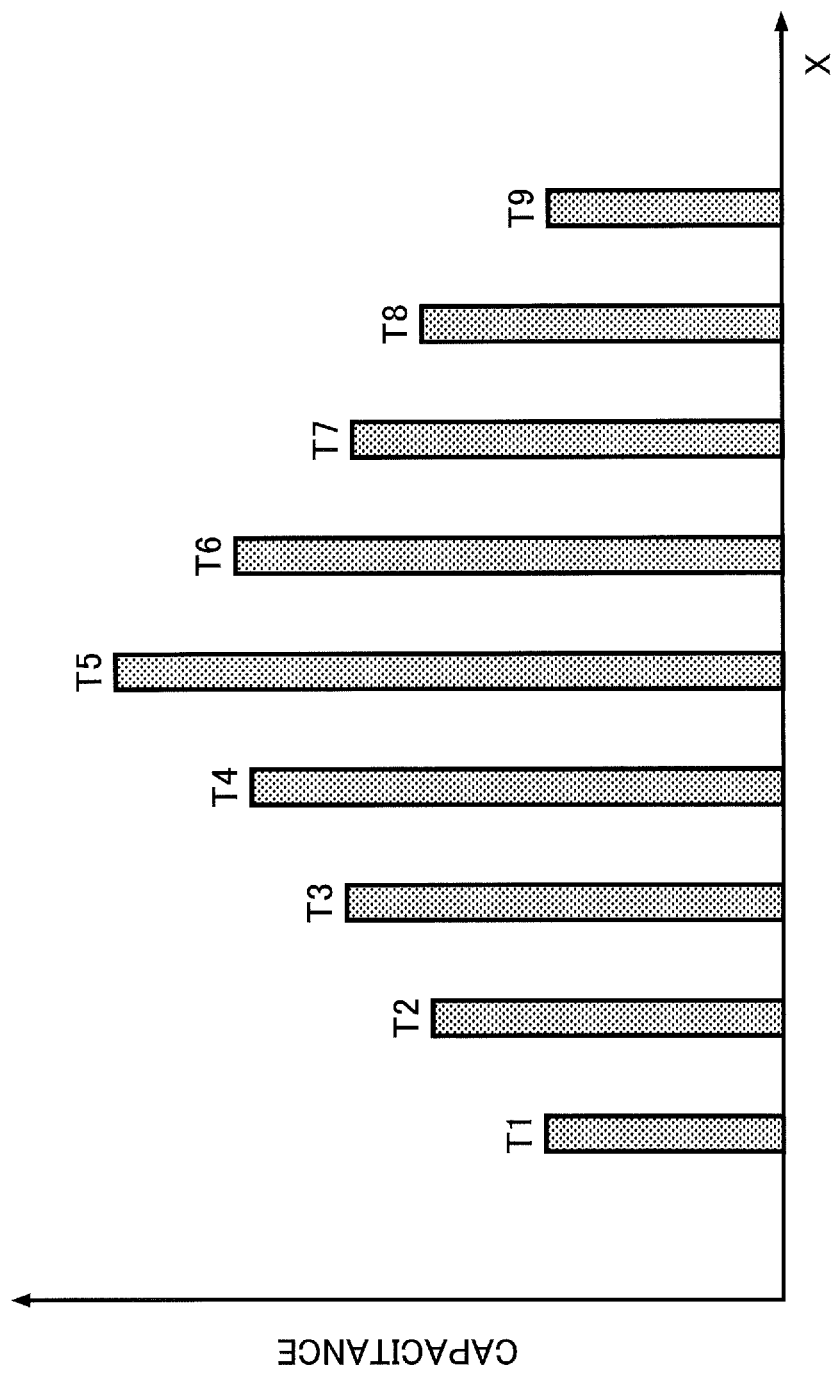

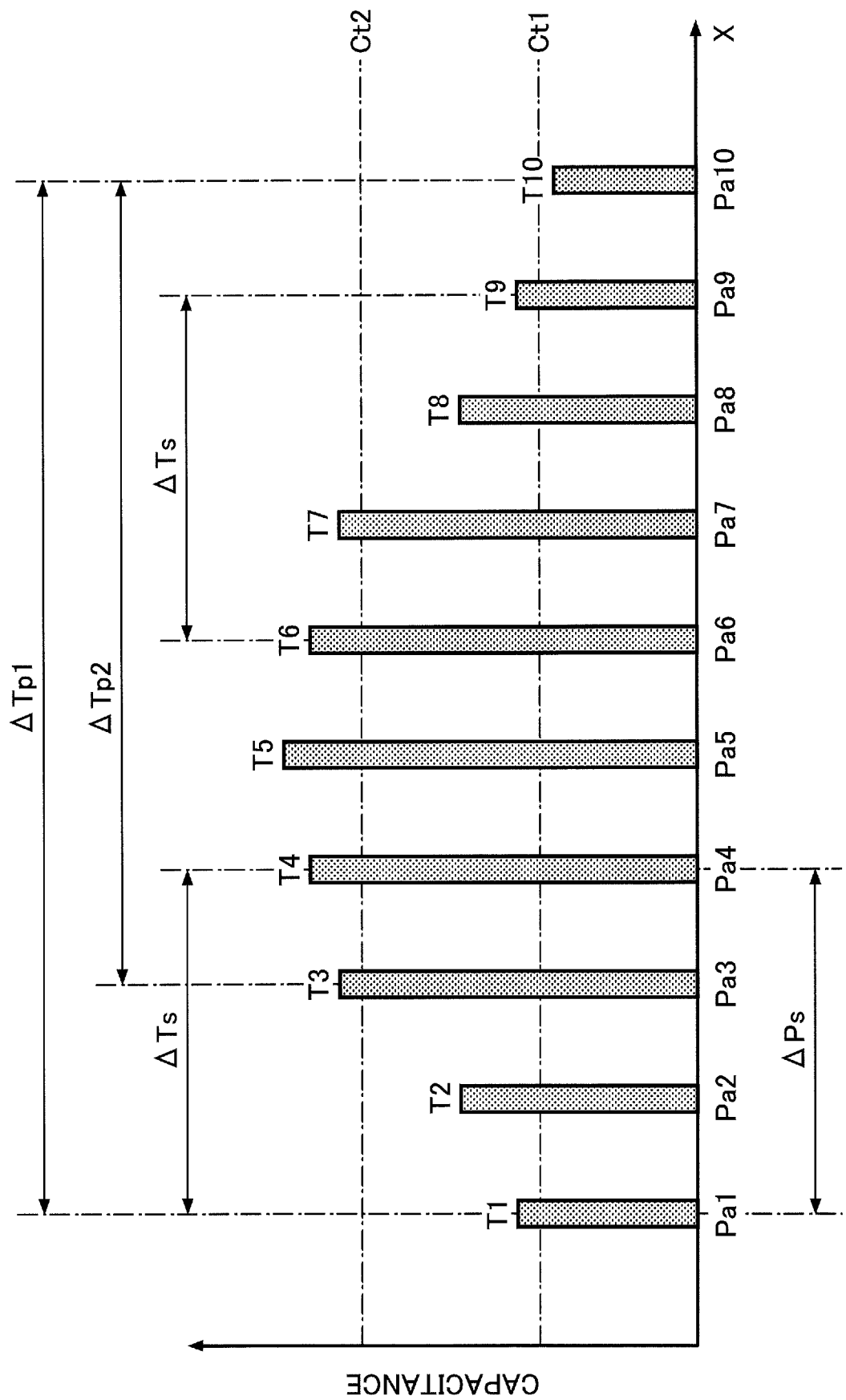

OPERATION INPUT DEVICE AND DOOR HANDLE

CROSS-REFERENCE TO RELATED APPLICATION

This application is a continuation application of International Application No. PCT/JP2018/027649 filed on Jul. 24, 2018, and designated the U.S., which is based upon and claims the benefit of priority of the prior Japanese Patent Application No. 2017-191202, filed on Sep. 29, 2017, the entire contents of which are incorporated herein by reference.

BACKGROUND OF THE INVENTION

1. Field of the Invention

The present invention relates to an operation input device and a door handle.

2. Description of the Related Art

On a door of a car for example, a door handle for opening and closing a door is provided outside a car. A control device for opening and closing a vehicle door that enables an operation such as opening and closing a door of a car or the like by a touch on a door handle is disclosed (for example, Patent Document 1).

Specifically, in such a control device for opening and closing a vehicle door, touching a door handle or the like with a hand and moving the hand that touched the door handle can perform an operation such as opening and closing a door.

However, in a control device for opening and closing a vehicle door or the like, when it is assumed that inputting information by a gesture performs an operation of opening and closing a vehicle door, false detection may be caused because there are variations among operators or the like in a gesture operation, and it is not possible to accurately determine whether an input of a gesture operation is performed.

Thus, in a gesture operation, an operation input device having low variations among operators or the like, is desired.

RELATED-ART DOCUMENTS

Patent Document

Patent Document 1: Japanese Laid-Open Patent Publication No. 2009-79353
Patent Document 2: Japanese Laid-Open Patent Publication No. 10-308148

SUMMARY OF THE INVENTION

According to one aspect of an embodiment, an operation input device includes a substrate formed of an insulator, a plurality of detecting electrodes provided on a surface of the substrate, and a controller, wherein the controller detects capacitance generated between each of the plurality of detecting electrodes and an operation body when the operation body is positioned in proximity to the substrate, and determines that a gesture operation by the operation body is performed when a duration from when the capacitance becomes greater than or equal to a first threshold to when the capacitance becomes greater than or equal to a second threshold is greater than or equal to a predetermined value, or when a length in which the operation body is moved from when the capacitance becomes greater than or equal to the first threshold to when the capacitance becomes greater than or equal to the second threshold is greater than or equal to a predetermined value, the first threshold being a threshold for the capacitance, and the second threshold being greater than the first threshold.

BRIEF DESCRIPTION OF THE DRAWINGS

FIG. 6B is a second explanatory drawing of an operation input device in a first embodiment;
FIG. 15 is an explanatory drawing of an operation input method in a fourth embodiment.

DESCRIPTION OF THE PREFERRED EMBODIMENTS

Figure 1:
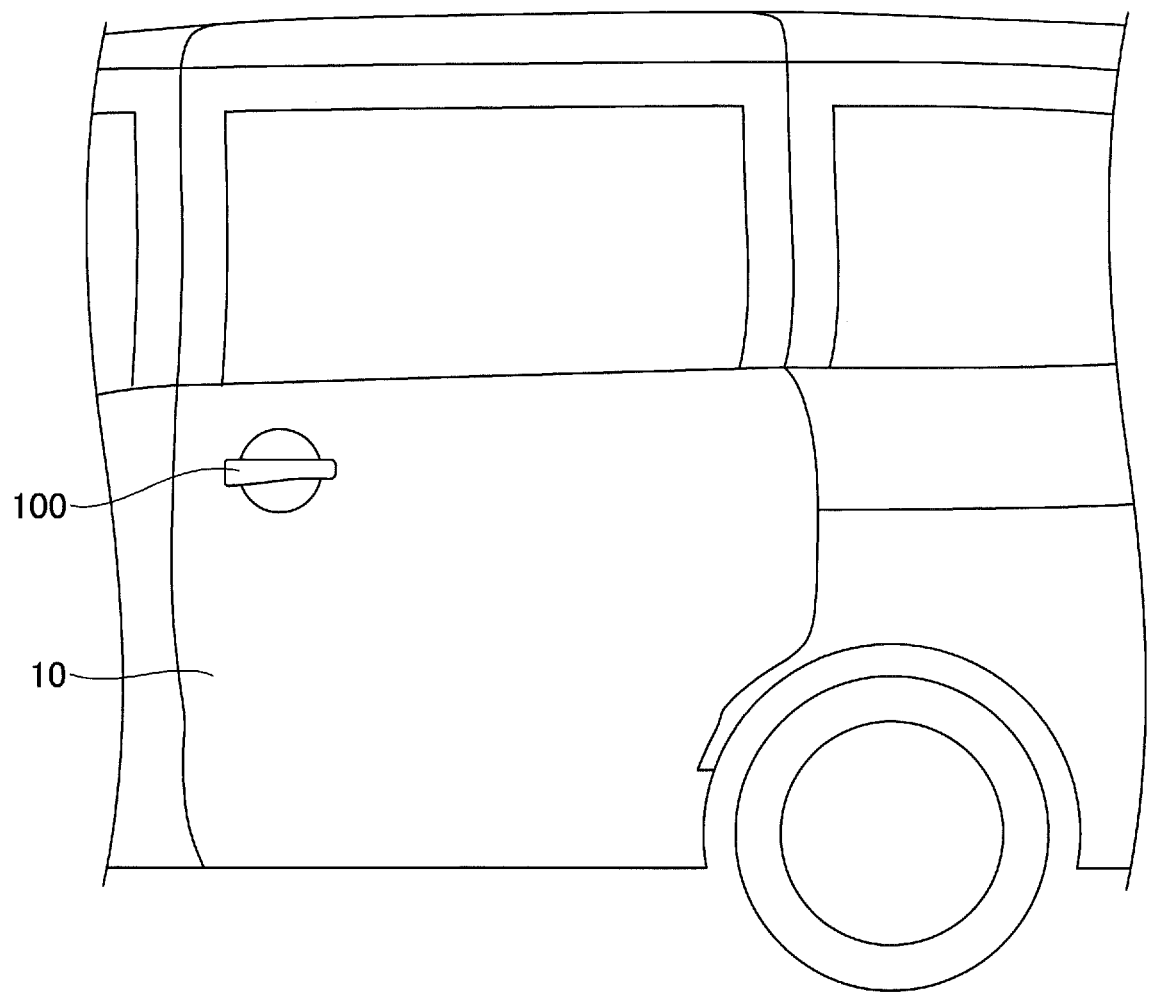
FIG. 1 is an explanatory drawing of a door to which a door handle is attached in a first embodiment.

Embodiments will be described in the following. It should be noted that the same component or the like is denoted by the same reference numeral, and a description will be omitted.

First Embodiment

An operation input device in a first embodiment will be described. An operation input device in the embodiment is included inside a door handle attached to a door of a car or the like, and operation information can be input through the door handle.

Figure 2:
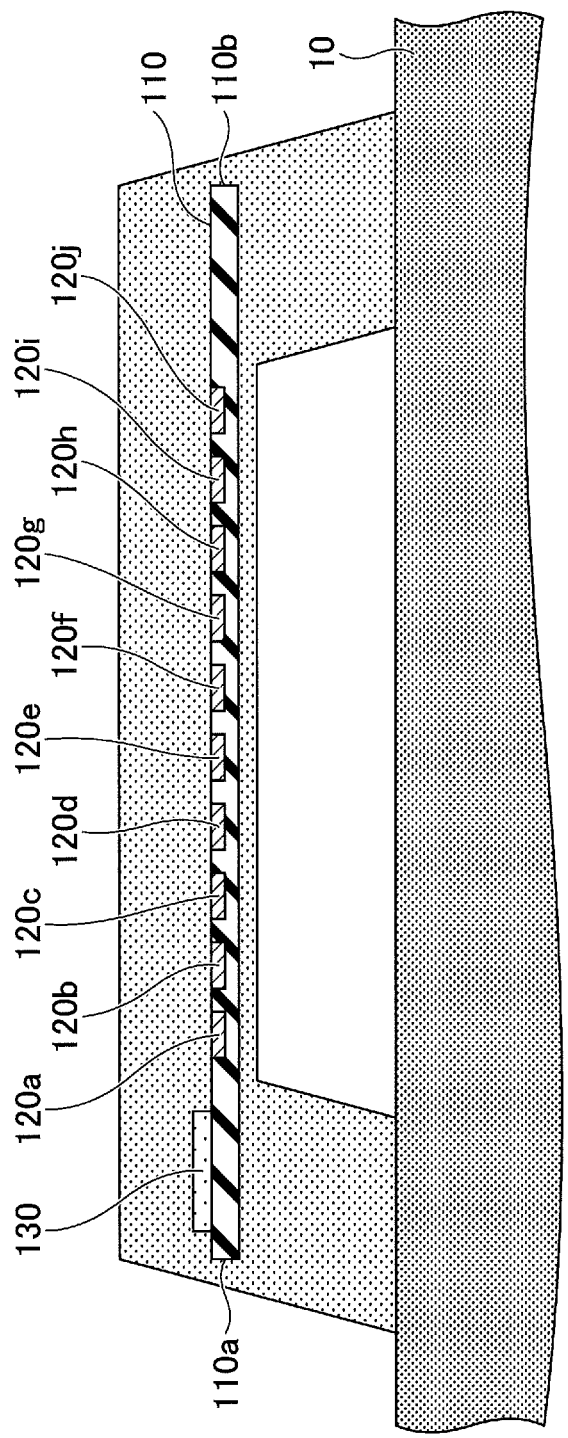
FIG. 2 is an explanatory drawing of a door handle in a first embodiment.

Specifically, the operation input device in the embodiment is included inside a door handle 100 attached to a door 10 of a car or the like illustrated in FIG. 1. As illustrated in FIG. 2, inside the door handle 100, a substrate 110 formed of an insulator is provided, and multiple detecting electrodes 120a, 120b, 120c, 120d, 120e, 120f, 120g, 120h, 120i, and 120j are arranged in a line in order on a surface of the substrate 110 from one end 110a toward the other end 110b of the substantially rectangular substrate 110, i.e., along a longitudinal direction of the substrate 110. Additionally, on the substrate 110, an integrated circuit 130 is provided, and each of the detecting electrodes 120a, 120b, 120c, 120d, 120e, 120f, 120g, 120h, 120i, and 120j is connected to the integrated circuit 130.

Figure 3:
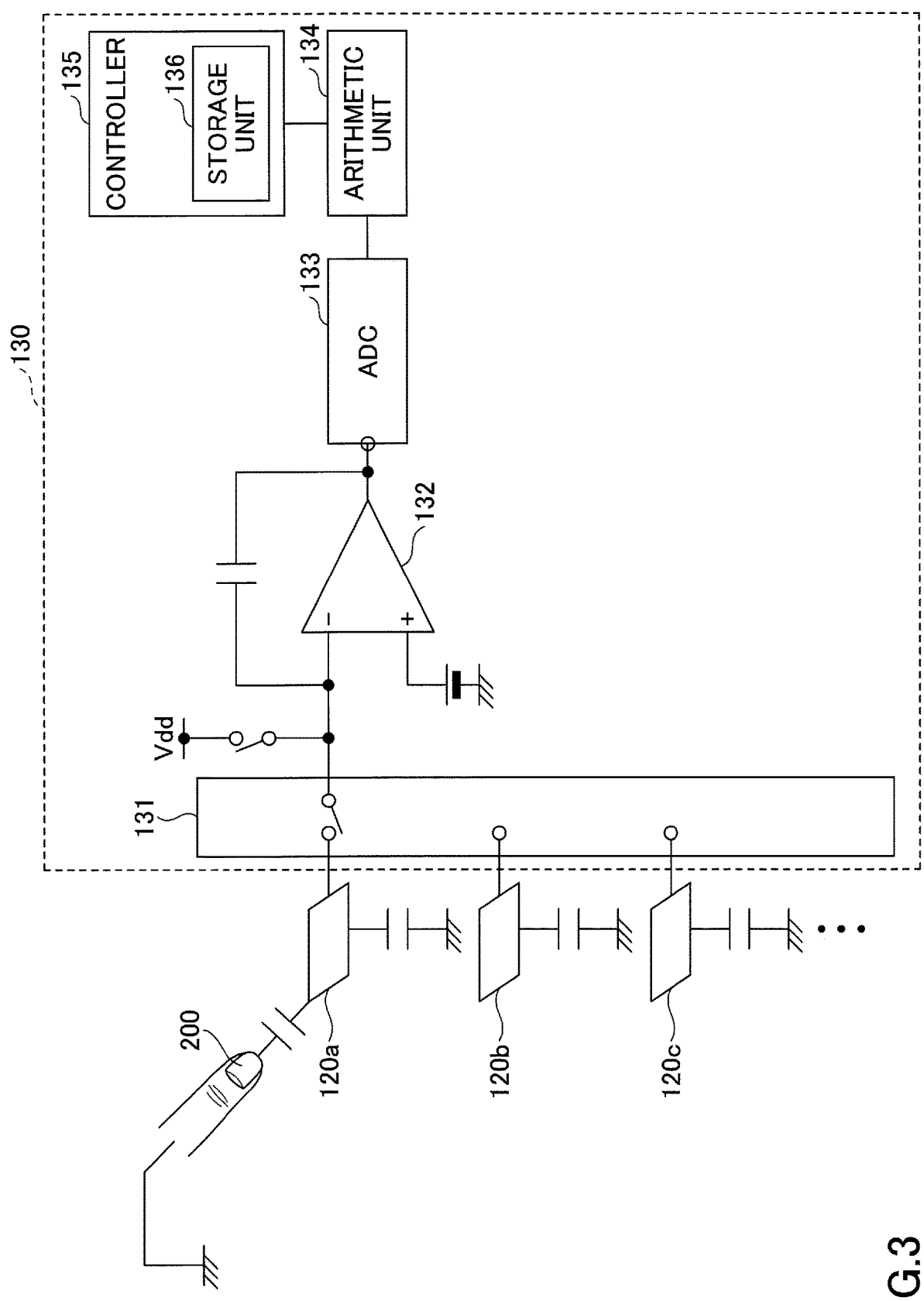
FIG. 3 is a structural drawing of an operation input device in a first embodiment.

As illustrated in FIG. 3, in the integrated circuit 130, a switch 131 connecting to each of the detecting electrodes 120a, 120b, 120c, 120d, 120e, 120f, 120g, 120h, 120i, and 120j is provided, and by closing the switch 131, predetermined voltage Vdd can be applied to the detecting electrodes 120a, 120b, 120c, 120d, 120e, 120f, 120g, 120h, 120i, and 120j. This enables detection of potential of each of the detecting electrodes 120a, 120b, 120c, 120d, 120e, 120f, 120g, 120h, 120i, and 120j. The detected potential is amplified by an amplifier 132, and an analog-to-digital converter (ADC) 133 converts an analog signal to a digital signal. Based on the digital signal converted as described above, an arithmetic unit 134 can calculate capacitance between each of the detecting electrodes 120a, 120b, 120c, 120d, 120e, 120f, 120g, 120h, 120i, and 120j, and a finger 200. Information about the calculated capacitance between each of the detecting electrodes 120a, 120b, 120c, 120d, 120e, 120f, 120g, 120h, 120i, and 120j, and the finger 200 is transmitted to a controller 135.

The operation input device in the embodiment is formed of the substrate 110 on which the detecting electrodes 120a, 120b, 120c, 120d, 120e, 120f, 120g, 120h, 120i, and 120j are provided, and the integrated circuit 130. The integrated circuit 130 includes the switch 131, the amplifier 132, the ADC 133, the arithmetic unit 134, and the controller 135, for example. Here, in the present specification, the substrate 110 on which the detecting electrodes 120a, 120b, 120c, 120d, 120e, 120f, 120g, 120h, 120i, and 120j are formed may be described as a sensor unit, and in the present specification, the finger 200 is described as an operation body since an operation is performed by the finger 200.

In the operation input device of the embodiment, based on the information obtained as described above about the capacitance between each of the detecting electrodes 120a, 120b, 120c, 120d, 120e, 120f, 120g, 120h, 1201, and 120j, and the finger 200, a gesture input by the finger 200 can be detected.

(Gesture Input)

Figure 4:
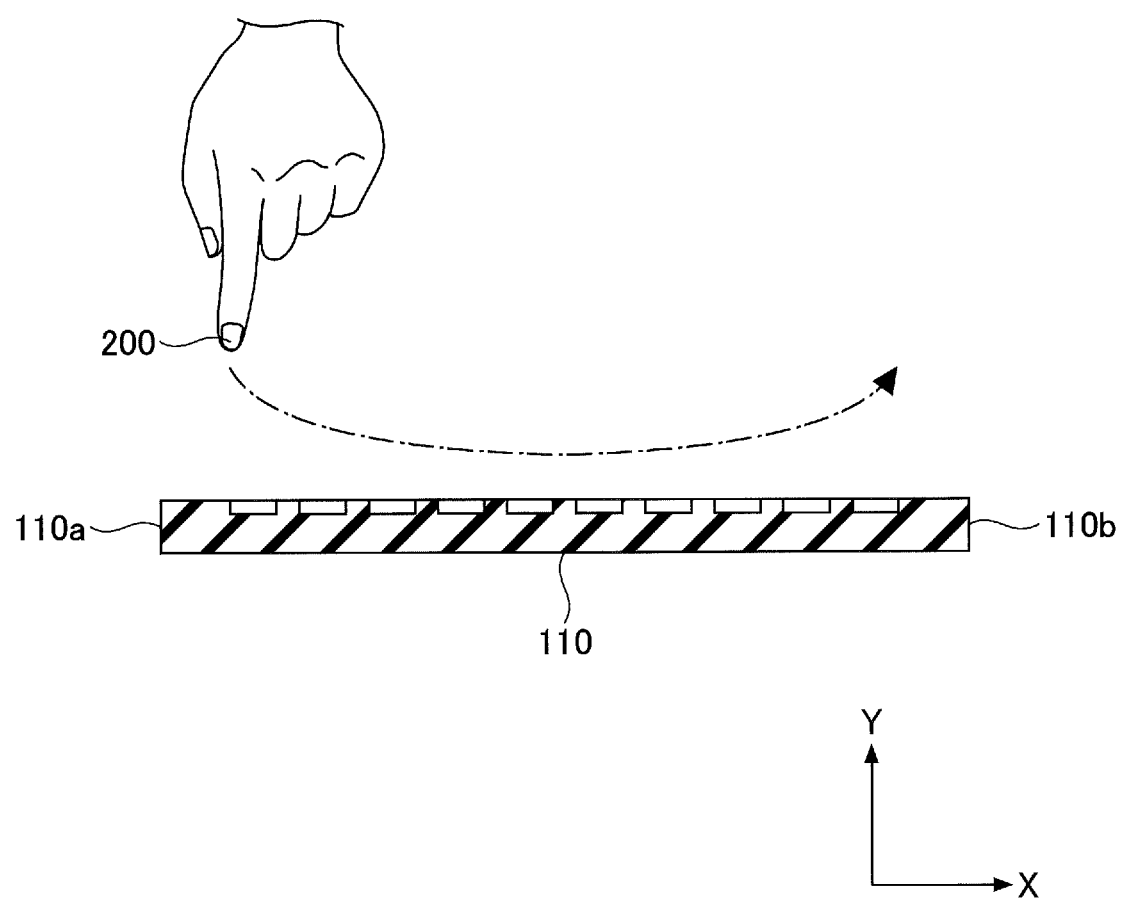
FIG. 4 is an explanatory drawing of a gesture operation in an operation input device.

Next, a gesture input by the finger 200 in the embodiment will be described. In the embodiment, the gesture input by the finger 200 is performed by moving the finger 200 such that a path illustrated by a dashed line in FIG. 4 is formed. Specifically, as described in FIG. 4, the gesture input is performed by moving the finger 200 from one end 110a side toward the other end 110b side of the substrate 110, and performing an operation of moving the finger 200 closer to the substrate 110 at a center part of the substrate 110. As such a case, for example, a case of making a gesture of sliding a finger in a lateral direction with contacting or being in proximity to a surface of the door handle illustrated in FIG. 2 is considered.

Figure 5A:
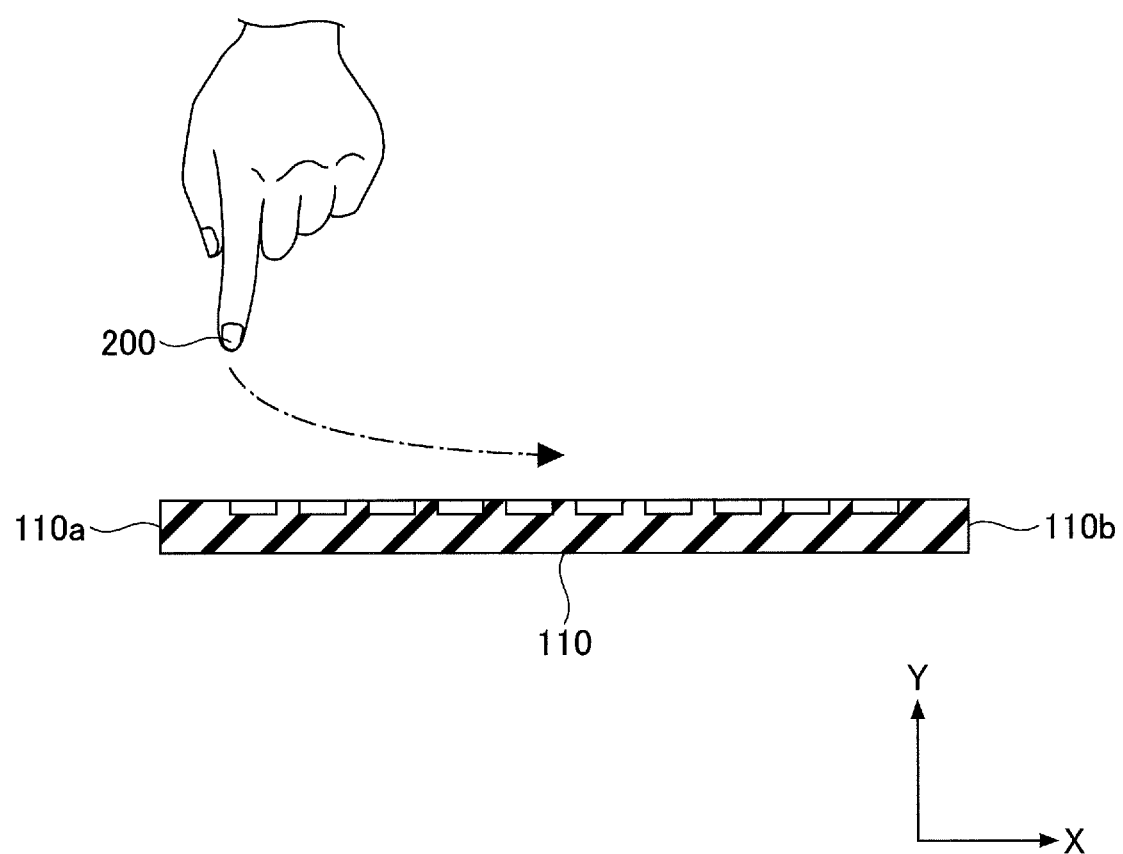
FIG. 5A is a first explanatory drawing of a gesture operation in an operation input device of a first embodiment.
Figure 5B:
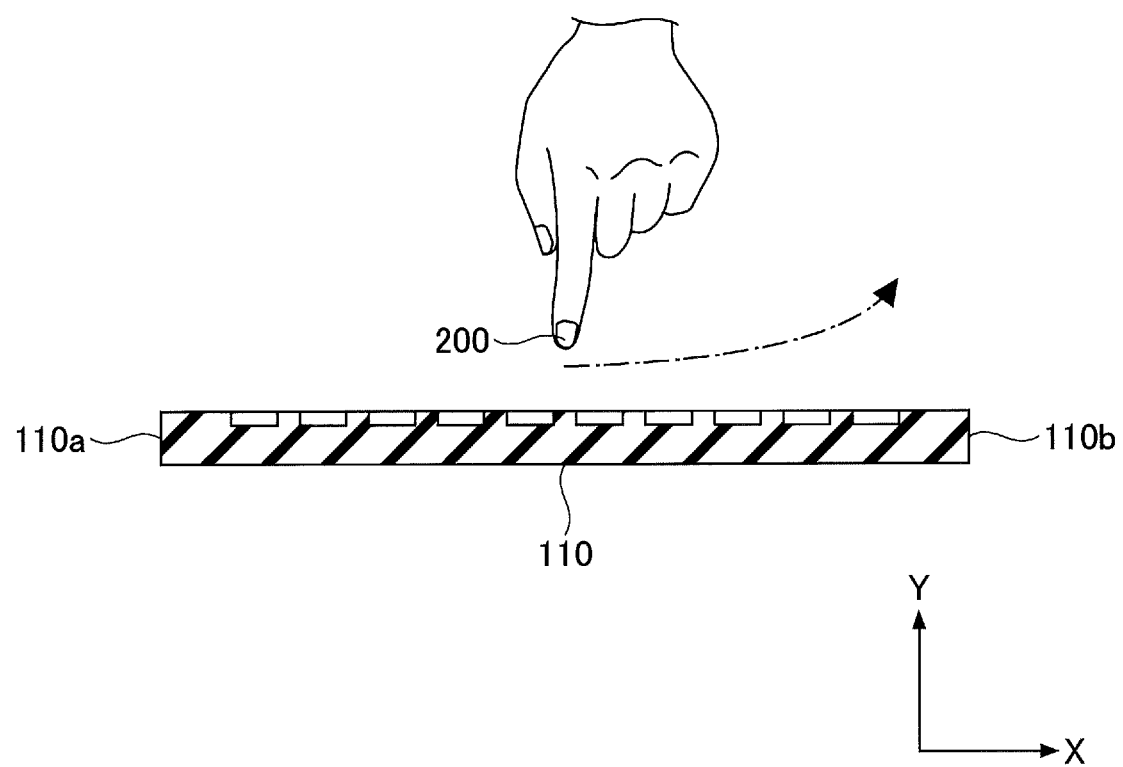
FIG. 5B is a second explanatory drawing of a gesture operation in an operation input device of a first embodiment.

The path of the finger 200 to be a gesture input illustrated in FIG. 4 can be divided into an operation of moving the finger 200 from one end 110a side toward the other end 110b side of the substrate 110 and closer to the substrate 110 as illustrated in FIG. 5A, and an operation of moving the finger 200 from one end 110a side toward the other end 110b side of the substrate 110 and away from the substrate 110 as illustrated in FIG. 5B.

A direction in which the detecting electrodes 120a, 120b, 120c, 120d, 120e, 120f, 120g, 120h, 120i, and 120j are arranged on the substrate 110 is an X direction, and a direction orthogonal to the X direction is a Y direction, and the operation illustrated in FIG. 4 will be described. In this case, a distance Y that is a distance in which the finger 200 is at a position closest to the substrate 110 is a distance in the Y direction, and when the finger 200 is moved as illustrated in FIG. 4, the distance Y varies depending on an X position as illustrated in FIG. 6A.

Between each of the detecting electrodes 120a, 120b, 120c, 120d, 120e, 120f, 120g, 120h, 120i, and 120j on the substrate 110 and the finger 200, the capacitance is generated. When the finger 200 is moved closer to the substrate 110, the capacitance between each of the detecting electrodes 120a, 120b, 120c, 120d, 120e, 120f, 120g, 120h, 120i, and 120j, and the finger 200 becomes large, and when the finger 200 is moved away from the substrate 110, the capacitance between each of the detecting electrodes 120a, 120b, 120c, 120d, 120e, 120f, 120g, 120h, 120i, and 120j, and the finger 200 becomes small. In the embodiment, a direction in the X direction in which the finger 200 is moved and a right direction in FIG. 6A and other drawings may be described as a +X direction.

Figure 6A:
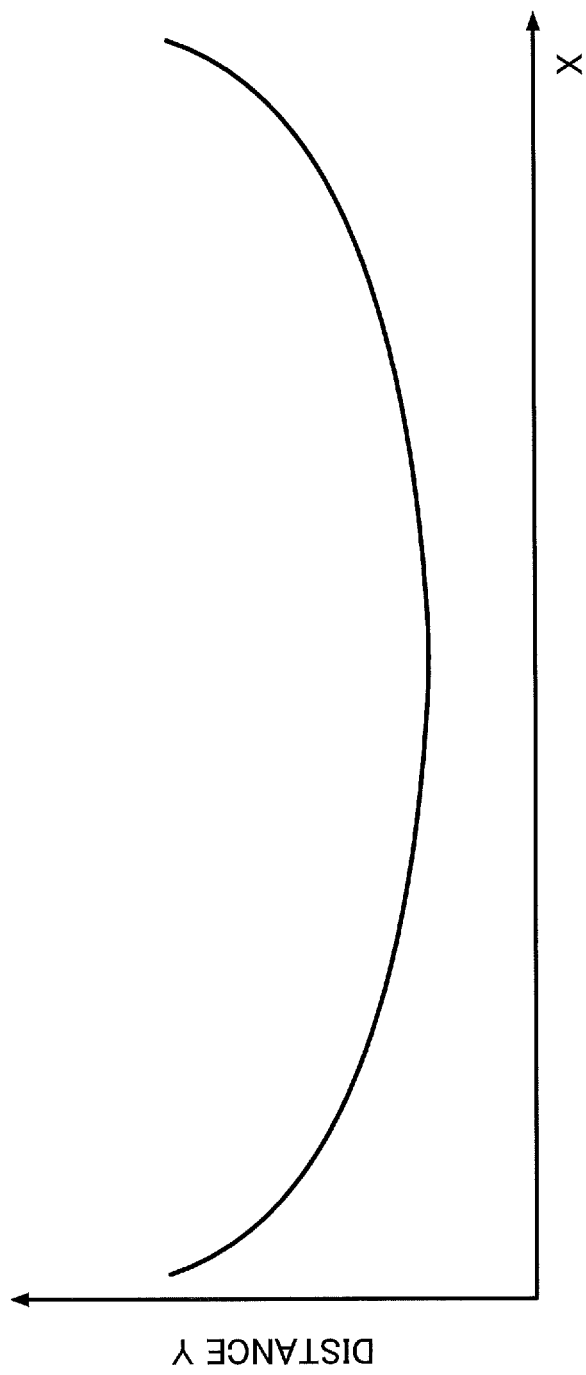
FIG. 6A is a first explanatory drawing of an operation input device in a first embodiment.

That is, when a path of the finger 200 being moved at a gesture input is as illustrated in FIG. 4 and the finger 200 is moved in the +X direction, i.e., in a direction in which a value of a position X increases as illustrated in FIG. 6A, the distance Y gradually becomes short at first, but gradually becomes long later. Thus, a value of the capacitance between each of the detecting electrodes 120a, 120b, 120c, 120d, 120e, 120f, 120g, 120h, 120i, and 120j on the substrate 110 and the finger 200 becomes small at a first part in which the distance Y between the finger 200 and substrate 110 is long, becomes large at a middle part in which the distance Y between the finger 200 and substrate 110 is short, and becomes small when the distance Y between the finger 200 and substrate 110 is long again later, as illustrated in FIG. 6B.

Here, FIG. 6B illustrates changes over time of the capacitance detected by the operation input device in the embodiment. Specifically, FIG. 6B illustrates changes over time of the capacitance between the detecting electrodes 120a, 120b, 120c, 120d, 120e, 120f, 120g, 120h, 120i, and 120j on substrate 110 and the finger 200. Time T1, T2, T3, T4, T5, T6, T7, T8, and T9 is in order of time, and the finger 200 is moved from the time T1 to the time T9, and the capacitance is detected. FIG. 6B illustrates a position of the electrode and a value of the capacitance at a peak of a distribution of the capacitance detected by the detecting electrodes 120a, 120b, 120c, 120d, 120e, 120f, 120g, 120h, 120i, and 120j at each time. Thus, it can be considered that the finger 200 exists at a position X in which the capacitance is at a peak at each of the time T1 to the time T9.

Figure 7:
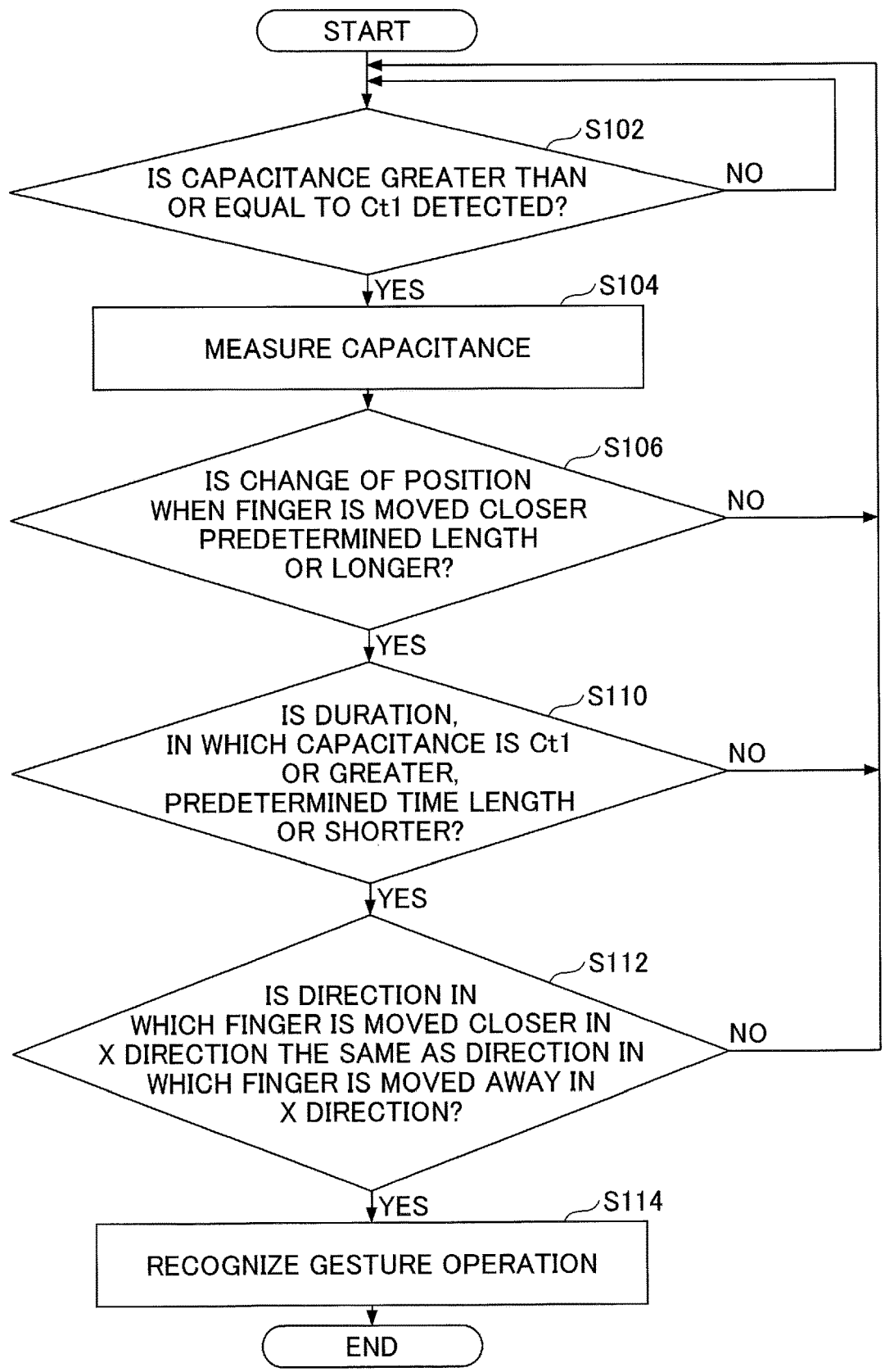
FIG. 7 is a first flowchart of an operation input method in a first embodiment.
Figure 8:
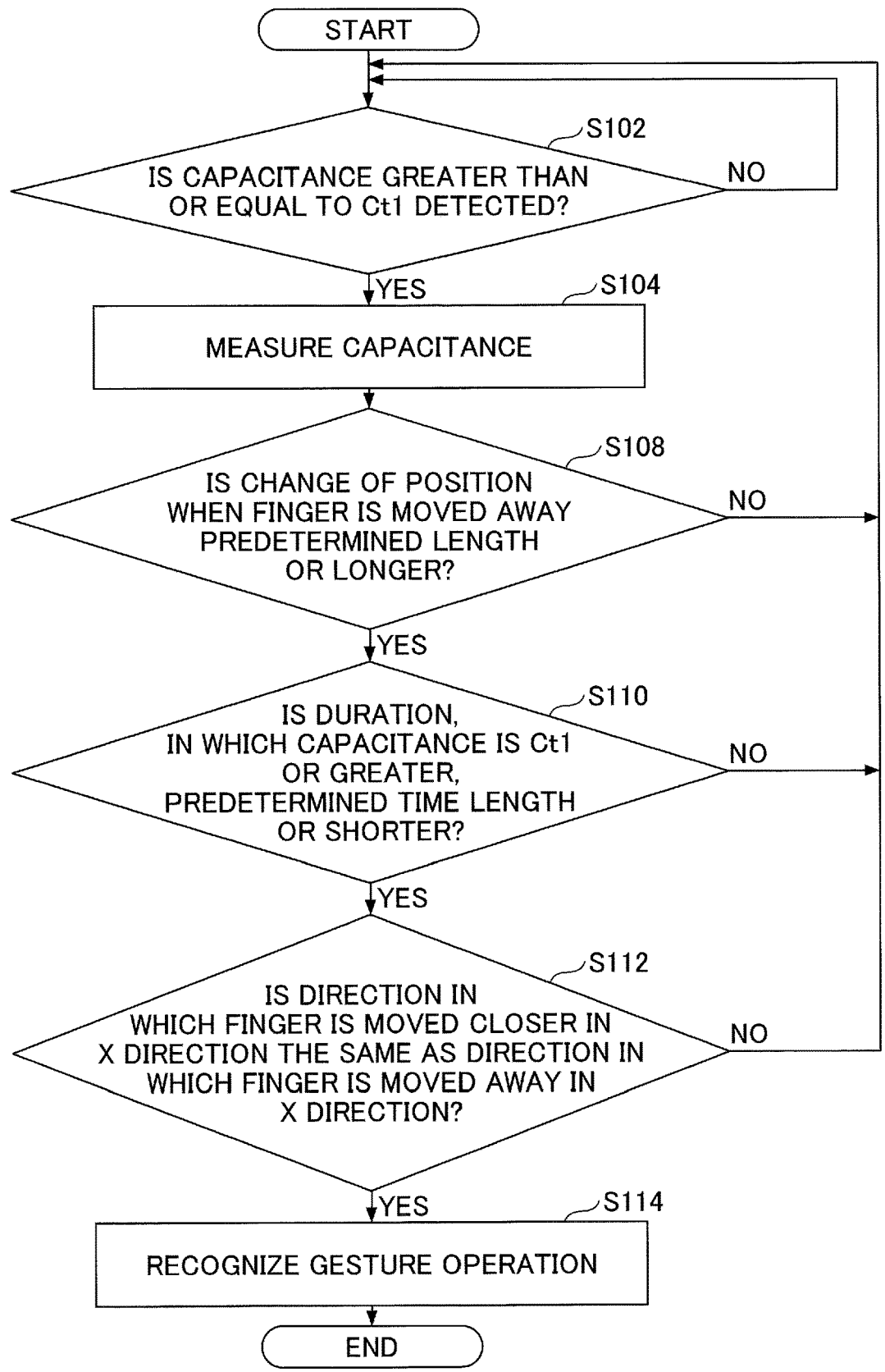
FIG. 8 is a second flowchart of an operation input method in a first embodiment.

An operation input method in the operation input device of the embodiment will be described based on FIG. 7 and FIG. 8. FIG. 7 is a flowchart of a detecting method that detects a gesture operation of moving the finger 200 in the +X direction and closer to the operation input device in the embodiment. FIG. 8 is a flowchart of a detecting method that detects a gesture operation of moving the finger 200 in the +X direction and away from the operation input device in the embodiment.

(First Operation Input Method)

Figure 9:
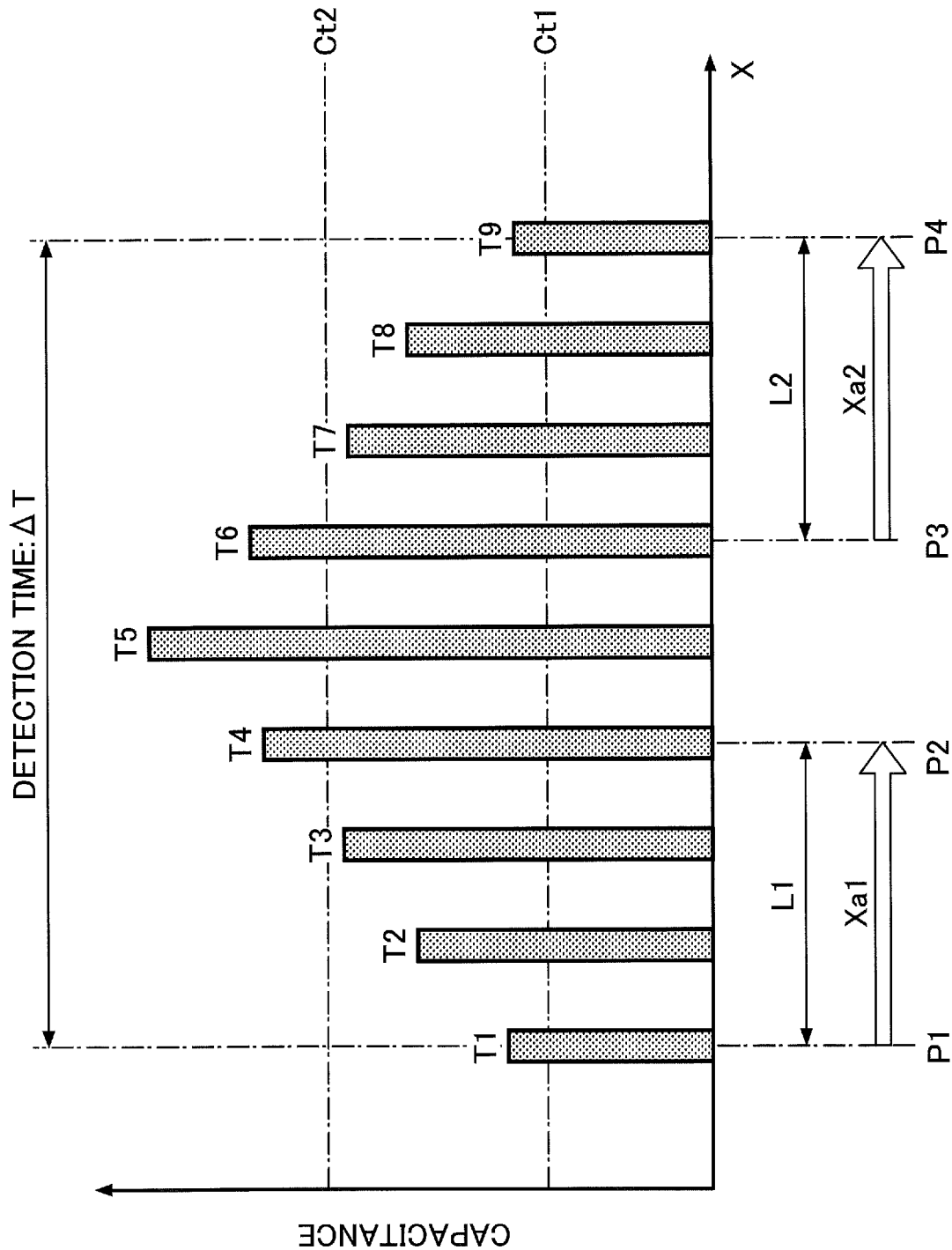
FIG. 9 is an explanatory drawing of an operation input method in a first embodiment.

FIG. 7 is a flowchart of a detecting method that detects a gesture operation of moving the finger 200 in the +X direction and closer to the operation input device in the embodiment. That is, as illustrated in FIG. 5A, the detecting method detects a gesture operation of moving the finger 200 from one end 110a toward the other end 110b of the substrate 110 and closer to the substrate 110. In the embodiment, as illustrated in FIG. 9, a gesture operation by the finger 200 is detected by setting a first threshold Ct1 and a second threshold Ct2 that is greater than the first threshold Ct1 with respect to the detected capacitance. In the embodiment, the following description assumes that a position in the X direction where the capacitance greater than or equal to the first threshold Ct1 is detected first is P1, a position in the X direction where subsequently the capacitance greater than or equal to the second threshold Ct2 is detected is P2, a position in the X direction where the capacitance greater than or equal to the second threshold Ct2 is detected last is P3, and a position in the X direction where the capacitance greater than or equal to the first threshold Ct1 is detected last is P4. In the embodiment, for example, the first threshold Ct1 is 0.01 pF and the second threshold Ct2 is 1 pF. Here, FIG. 9 illustrates a position of the electrode and a value of the capacitance at a peak of a distribution of the capacitance detected by the detecting electrodes at each time.

First, as described in step S102, in the operation input device of the embodiment, it is determined whether the capacitance greater than or equal to the first threshold Ct1 is detected. When the capacitance greater than or equal to the first threshold Ct1 is detected, the flow proceeds to step S104. When the capacitance greater than or equal to the first threshold Ct1 is not detected, the flow repeats step S102. Specifically, in step S102, a standby state is continued until the capacitance greater than or equal to the first threshold Ct1 is detected. In the standby state, a regular cycle measurement may be performed, but an intermittent operation of a long cycle measurement may be performed for power saving. In order to wake up the operation input device from the standby state, a threshold other than the first threshold Ct1 may be specified, and, for example, a threshold smaller than the first threshold Ct1 may be specified.

Next, as described in step S104, a gesture determination is performed by measuring the capacitance in the operation input device of the embodiment. A value of the measured capacitance may be stored in a storage unit 136 provided in the controller 135. For example, a measurement of the capacitance is performed every 1 millisecond. Here, when a duration from when a value of the measured capacitance first becomes greater than or equal to the first threshold Ct1 to when a value of the measured capacitance becomes smaller than the first threshold Ct1 is longer than a predetermined time length, it is determined that there is no gesture and the flow may proceed to step S102. Additionally, when the capacitance does not become greater than or equal to the second threshold Ct2 even after a lapse of another predetermined time length after the capacitance first becomes greater than or equal to the first threshold Ct1, it is determined that there is no gesture and the flow may proceed to step S102.

Next, as described in step S106, it is determined whether a change of a position of the finger 200 when the finger 200 is moved closer is in a predetermined direction and is longer than or equal to a predetermined length. Specifically, a moving direction Xa1 of the finger 200 in the X direction and a length L1 between the position P1 and the position P2 are calculated by the position P1 in which the capacitance is greater than or equal to the first threshold Ct1 and the position P2 in which subsequently the capacitance is greater than or equal to the second threshold Ct2, and it is determined whether the moving direction Xa1 of the finger 200 in the X direction is the +X direction and the length L1 is longer than or equal to a predetermined length. When the moving direction Xa1 of the finger 200 in the X direction is the +X direction and the length L1 is longer than or equal to the predetermined length, the flow proceeds to step S110, and when the length L1 is not longer than or equal to the predetermined length, the flow proceeds to step S102. In the embodiment, the predetermined length may be described as a first length.

Next, as described in step S110, it is determined whether a duration (i.e., a detection duration $\Delta T$) in which the detected capacitance is greater than or equal to the first threshold Ct1 is shorter than or equal to a predetermined time length. Specifically, in a case illustrated in FIG. 9, the detection duration $\Delta T$ in which a value of the measured capacitance is greater than or equal to the first threshold Ct1 is calculated by $\Delta T = T9 - T1$ where the time T1 is time when a value of the measured capacitance first becomes greater than or equal to the first threshold Ct1 and where the time T9 is time when a value of the measured capacitance is last greater than or equal to the first threshold Ct1, and it is determined whether the detection duration $\Delta T$ is shorter than or equal to a predetermined time length. When the detection duration $\Delta T$ is shorter than or equal to the predetermined time length, the flow proceeds to step S112, and when the detection duration $\Delta T$ is not shorter than or equal to the predetermined time length, the flow proceeds to step S102. The predetermined time length is 500 milliseconds for example, and in the embodiment, the predetermined time length may be described as a first time length.

Next, as described in step S112, it is determined whether a direction in the X direction in which the finger 200 is moved closer to the operation input device of the embodiment is the same as a direction in the X direction in which the finger 200 is moved away from the operation input device of the embodiment. Specifically, a moving direction Xa2 of the finger 200 in the X direction is obtained by the position P3 in which a value of the measured capacitance is last greater than or equal to the second threshold Ct2 and the position P4 in which subsequently a value of the measured capacitance is last greater than or equal to the first threshold Ct1. When the moving direction Xa1 and the moving direction Xa2 are in the same direction and both are in the +X direction, the flow proceeds to step S114. When the moving direction Xa1 and the moving direction Xa2 are not in the same direction or both are not in the +X direction, the flow proceeds to step S102.

Next, as described in step S114, in the controller 135 or the like, an operation by the finger 200 is recognized as a gesture operation. This can open a door to which a door handle including the operation input device of the embodiment inside is attached.

By the steps above, an operation input can be performed using the operation input device in the embodiment. Here, in the description above, for convenience, a case in which the capacitance is collectively measured in step S104 is described. However, the method is not limited to this. For example, steps as of step S106 may be performed with measuring the capacitance after the capacitance becomes greater than or equal to the second threshold Ct2.

(Second Operation Input Method)

FIG. 8 is a flowchart of a detecting method that detects a gesture operation of moving the finger 200 in the +X direction and away from the operation input device in the embodiment. That is, as illustrated in FIG. 5B, the detecting method detects a gesture operation of moving the finger 200 from one end 110a toward the other end 110b of the substrate 110 and away from the substrate 110. In this case, as illustrated in FIG. 9, a gesture operation by the finger 200 is also detected by setting the first threshold Ct1 and the second threshold Ct2 that is greater than the first threshold Ct1 for the detected capacitance.

First, as described in step S102, in the operation input device of the embodiment, it is determined whether the capacitance greater than or equal to the first threshold Ct1 is detected. When the capacitance greater than or equal to the first threshold Ct1 is detected, the flow proceeds to step S104. When the capacitance greater than or equal to the first threshold Ct1 is not detected, the flow repeats step S102.

Next, as described in step S104, a gesture determination is performed by measuring the capacitance in the operation input device of the embodiment. A value of the measured capacitance may be stored in the storage unit 136 provided in the controller 135.

Next, as described in step S108, it is determined whether a change of a position of the finger 200 when the finger 200 is moved away is in a predetermined direction and longer than or equal to a predetermined length. Specifically, the moving direction Xa2 of the finger 200 in the X direction and the length L2 between the position P3 and the position P4 are calculated by the position P3 in which the capacitance is last greater than or equal to the second threshold Ct2 and the position P4 in which the capacitance is last greater than or equal to the first threshold Ct1, and it is determined whether the moving direction Xa2 of the finger 200 in the X direction is the +X direction and the length L2 is longer than or equal to a predetermined length. When the moving direction Xa2 of the finger 200 in the X direction is the +X direction and the length L2 is longer than or equal to the predetermined length, the flow proceeds to step S110, and when the length L2 is not longer than or equal to the predetermined length, the flow proceeds to step S102. In the embodiment, the predetermined length may be described as a second length.

Next, as described in step S110, it is determined whether the duration (i.e., the detection duration ΔT) in which the detected capacitance is greater than or equal to the first threshold Ct1 is shorter than or equal to a predetermined time length. When the detection duration ΔT is shorter than or equal to the predetermined time length, the flow proceeds to step S112, and when the detection duration ΔT is not shorter than or equal to the predetermined time length, the flow proceeds to step S102.

Next, as described in step S112, it is determined whether a direction in the X direction in which the finger 200 is moved closer to the operation input device of the embodiment is the same as a direction in the X direction in which the finger 200 is moved away from the operation input device of the embodiment. When the moving direction Xa1 and the moving direction Xa2 are in the same direction and both are in the +X direction, the flow proceeds to step S114. When the moving direction Xa1 and the moving direction Xa2 are not in the same direction or both are not in the +X direction, the flow proceeds to step S102.

Next, as described in step S114, in the controller 135 or the like, an operation by the finger 200 is recognized as a gesture operation. This can open a door to which a door handle including the operation input device of the embodiment inside is attached.

By the steps above, an operation input can be performed using the operation input device in the embodiment.

In the description above, cases of determining based on the length L1 that is a distance in step S106 and based on the length L2 that is a distance in step S108 are described, but the lengths L1 and L2 described above may be a time length. Additionally, the first operation input method illustrated in FIG. 7 and the second operation input method illustrated in FIG. 8 may be combined. Specifically, step S108 illustrated in FIG. 8 may be added between step S106 and step S110 in the flowchart illustrated in FIG. 7. Additionally, in steps S106 and S108, a different function depending on the moving direction of the finger 200, such as a direction of opening and closing a door, may be added.

Second Embodiment

Figure 10:
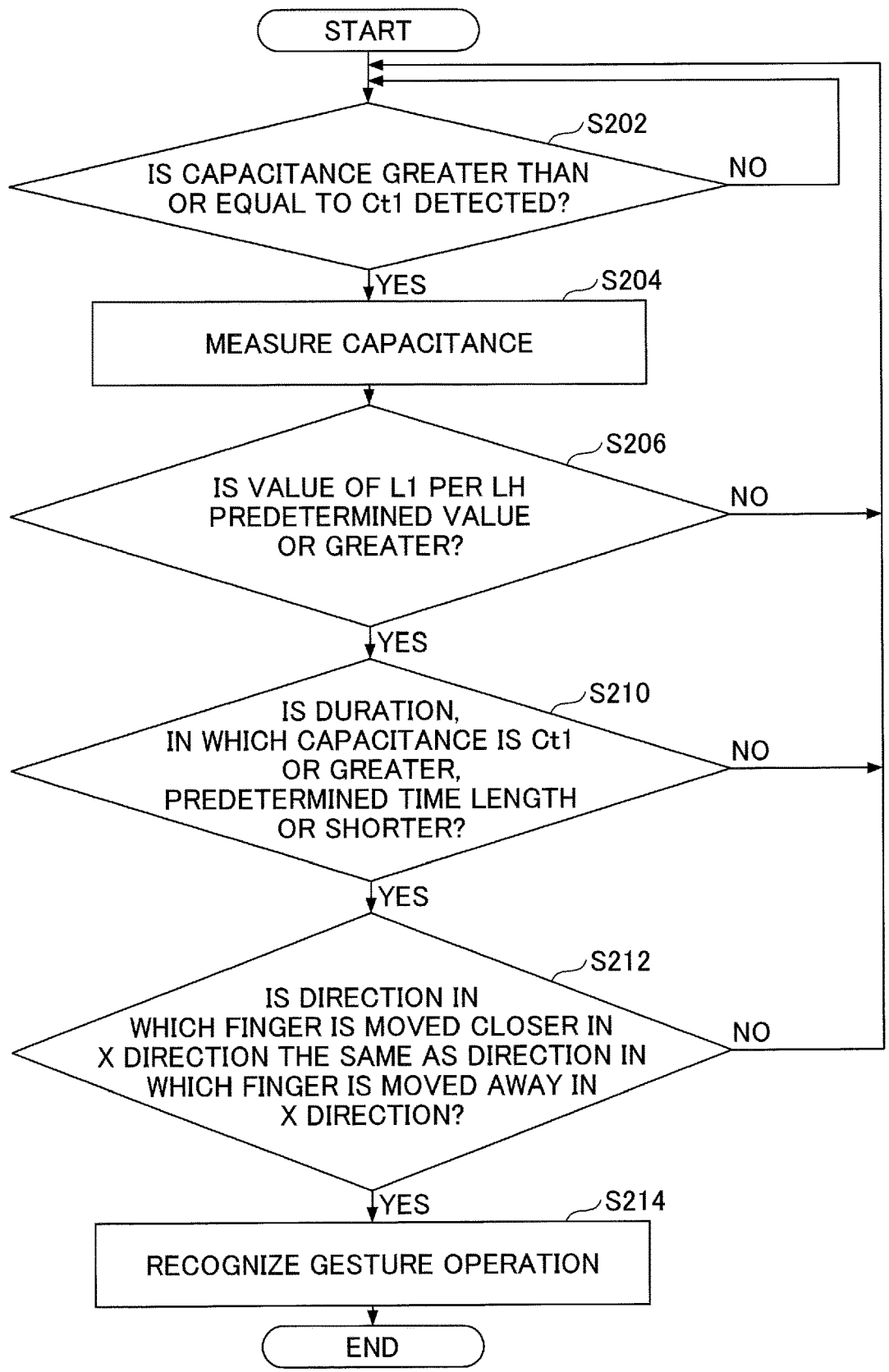
FIG. 10 is a first flowchart of an operation input method in a second embodiment.
Figure 11:
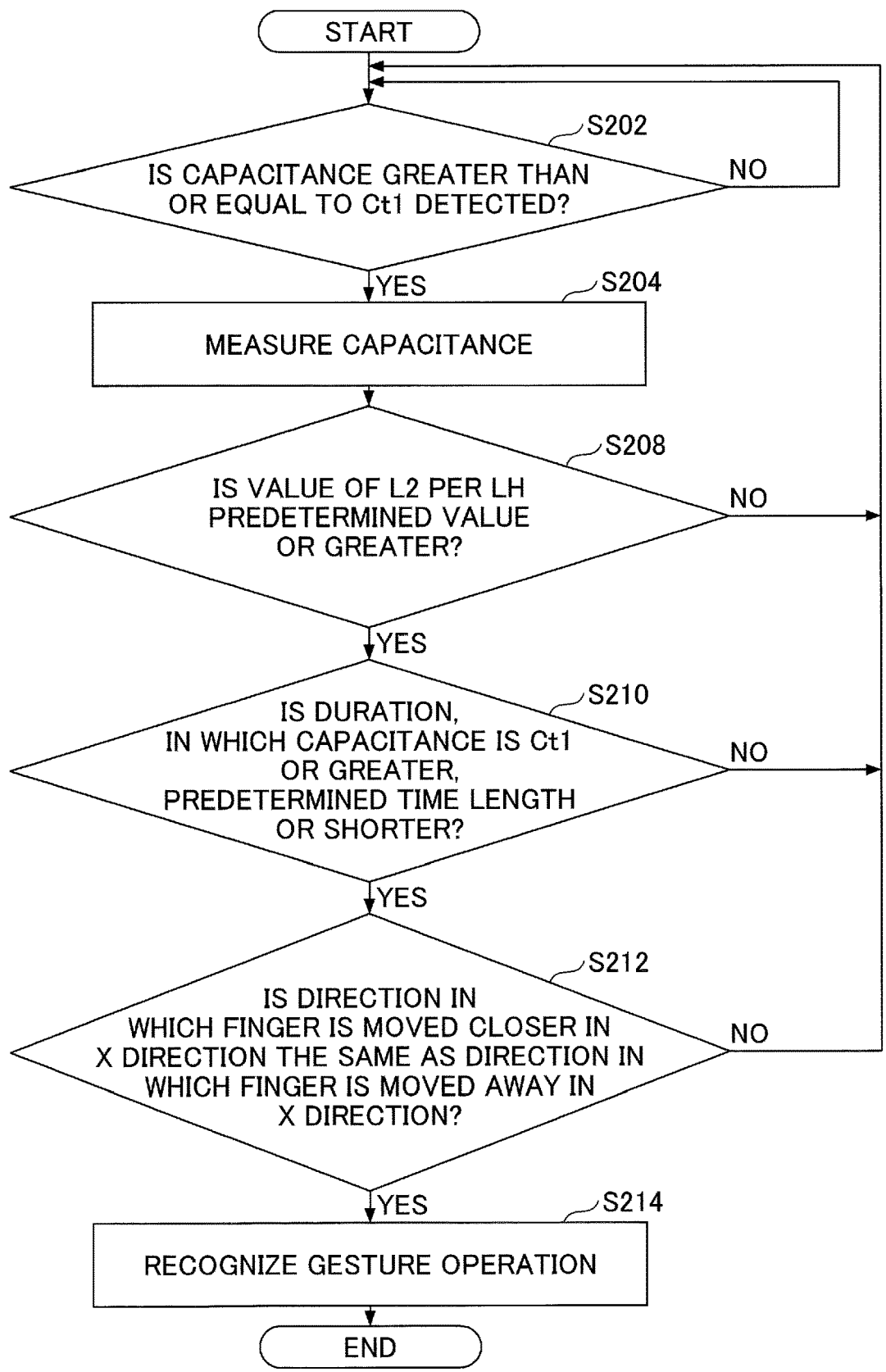
FIG. 11 is a second flowchart of an operation input method in a second embodiment.

Next, a second embodiment will be described. This embodiment is an operation input method using the operation input device included inside a door handle illustrated in FIG. 2 and other drawings. The operation input method in the embodiment will be described based on FIG. 10 and FIG. 11. FIG. 10 is a flowchart of a detection method that detects a gesture operation of moving the finger 200 in the +X direction and closer to the operation input device. FIG. 11 is a flowchart of a detecting method that detects a gesture operation of moving the finger 200 in the +X direction and away from the operation input device.

(Third Operation Input Method)

Figure 12:
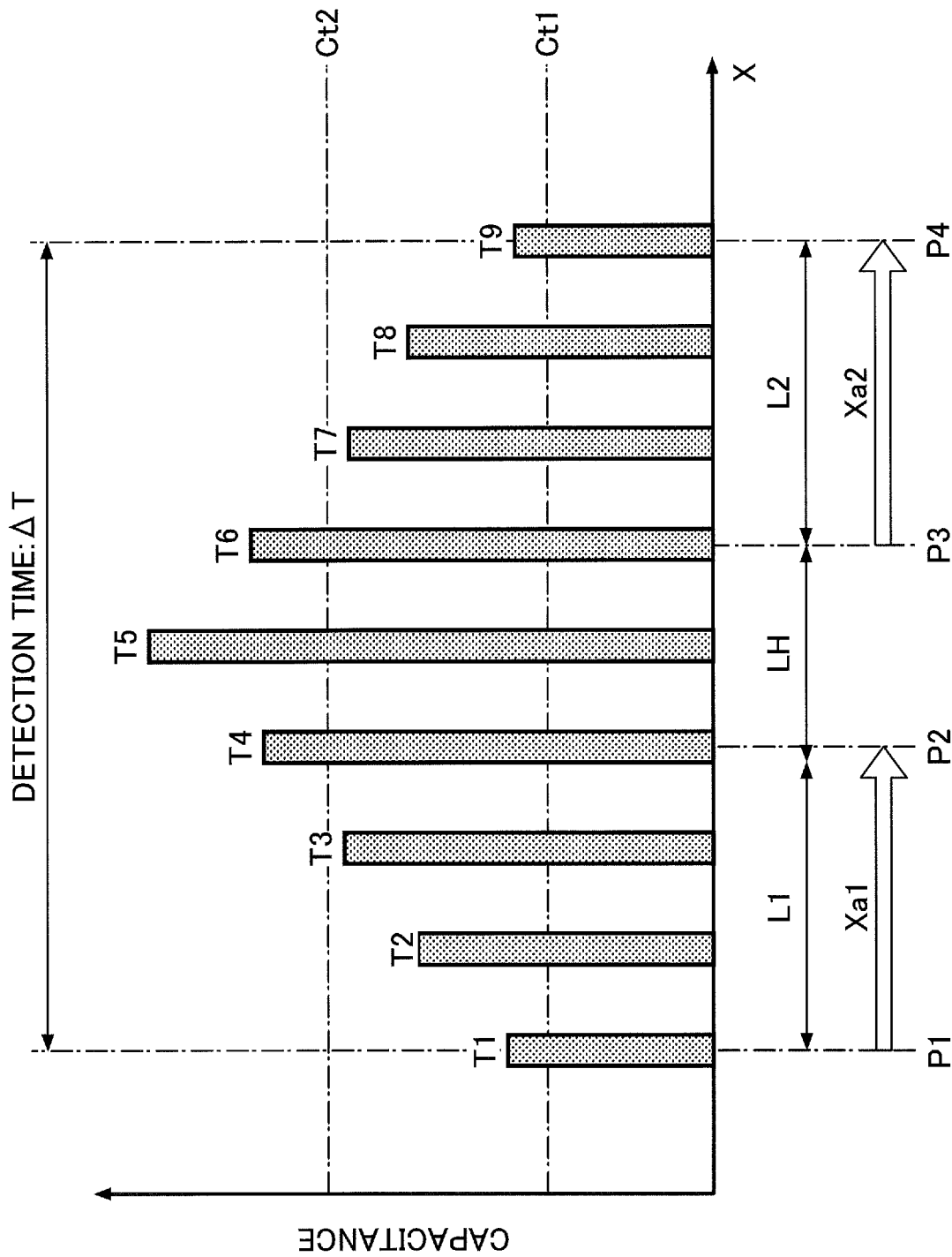
FIG. 12 is an explanatory drawing of an operation input method in a second embodiment.

FIG. 10 is a flowchart that detects a gesture operation, as illustrated in FIG. 5A, of moving the finger 200 from one end 110a toward the other end 110b of the substrate 110 and closer to the substrate 110. In the embodiment, as illustrated in FIG. 12, a gesture operation by the finger 200 is detected by setting the first threshold Ct1 and the second threshold Ct2 that is greater than the first threshold Ct1 for the detected capacitance. In the embodiment, a position in the X direction where the first threshold Ct1 is detected first is P1, a position in the X direction where the second threshold Ct2 is detected subsequently is P2, a position in the X direction where the second threshold Ct2 is detected last is P3, and a position in the X direction where the first threshold Ct1 is detected last is P4, and the embodiment will be described. Here, FIG. 12 illustrates a position of the electrode and a value of the capacitance at a peak of a distribution of the capacitance detected by the detecting electrodes at each time.

First, as described in step S202, in the operation input device, it is determined whether the capacitance greater than or equal to the first threshold Ct1 is detected. When the capacitance greater than or equal to the first threshold Ct1 is detected, the flow proceeds to step S204. When the capacitance greater than or equal to the first threshold Ct1 is not detected, the flow repeats step S202.

Next, as described in step S204, a gesture determination is performed by measuring the capacitance in the operation input device of the embodiment. A value of the measured capacitance may be stored in a storage unit 136 provided in the controller 135. For example, a measurement of the capacitance is performed every 1 millisecond. Here, when a duration from when a value of the measured capacitance first becomes greater than or equal to the first threshold Ct1 to when a value of the measured capacitance becomes smaller than the first threshold Ct1 is longer than a predetermined time length, it is determined that there is no gesture and the flow may proceed to step S202. Additionally, when the capacitance does not become greater than or equal to the second threshold Ct2 even after a lapse of another predetermined time length after the capacitance first becomes greater than or equal to the first threshold Ct1, it is determined that there is no gesture and the flow may proceed to step S202.

Next, as described in step S206, it is determined whether a change of a position of the finger 200 when the finger 200 is moved closer is in a predetermined direction and whether a value of the length L1, which is a change of a position of the finger 200 when the finger 200 is moved closer, per a length LH in which the finger 200 is moved in close proximity is greater than or equal to a predetermined value. Specifically, the moving direction Xa1 of the finger 200 in the X direction and the length L1 between the position P1 and the position P2 are calculated by the position P1 in which the capacitance is greater than or equal to the first threshold Ct1 and the position P2 in which subsequently the capacitance is greater than or equal to the second threshold Ct2, and the length LH between the position P2 and the position P3 is calculated by the position P2 that is a position in the X direction where the second threshold Ct2 is detected and the position P3 that is a position in the X direction where the second threshold Ct2 is detected last, and it is determined whether the moving direction Xa1 of the finger 200 in the X direction is the +X direction and a ratio of the length L1 to the length LH is greater than or equal to a predetermined value. When the moving direction Xa1 of the finger 200 in the X direction is the +X direction and a ratio of the length L1 to the length LH is greater than or equal to a predetermined value, the flow proceeds to step S210, and when a ratio of the length L1 to the length LH is not greater than or equal to a predetermined value, the flow proceeds to step S202.

Next, as described in step S210, it is determined whether the duration (i.e., the detection duration $\Delta T$) in which the detected capacitance is greater than or equal to the first threshold Ct1 is shorter than or equal to a predetermined time length. When the detection duration $\Delta T$ is shorter than or equal to the predetermined time length, the flow proceeds to step S212, and when the detection duration $\Delta T$ is not shorter than or equal to the predetermined time length, the flow proceeds to step S202.

Next, as described in step S212, it is determined whether a direction in the X direction in which the finger 200 is moved closer to the operation input device is the same as a direction in the X direction in which the finger 200 is moved away from the operation input device. When the moving direction Xa1 and the moving direction Xa2 are in the same direction and both are in the +X direction, the flow proceeds to step S214. When the moving direction Xa1 and the moving direction Xa2 are not in the same direction or both are not in the +X direction, the flow proceeds to step S202.

Next, as described in step S214, in the controller 135 or the like, an operation by the finger 200 is recognized as a gesture operation. This can open a door to which a door handle including the operation input device inside is attached.

By the steps above, an operation input can be performed using the operation input device. Here, in the description above, for convenience of description, a case in which the capacitance is collectively measured in step S204 is described. However, the method is not limited to this. For example, steps as of step S206 may be performed with measuring the capacitance when the capacitance becomes greater than or equal to the second threshold Ct2.

(Fourth Operation Input Method)

FIG. 11 is a flowchart that detects a gesture operation, as illustrated in FIG. 5B, of moving the finger 200 from one end 110a toward the other end 110b of the substrate 110 and away from the substrate 110.

First, as described in step S202, in the operation input device, it is determined whether the capacitance greater than or equal to the first threshold Ct1 is detected. When the capacitance greater than or equal to the first threshold Ct1 is detected, the flow proceeds to step S204. When the capacitance greater than or equal to the first threshold Ct1 is not detected, the flow repeats step S202.

Next, as described in step S204, a gesture determination is performed by measuring the capacitance in the operation input device of the embodiment. A value of the measured capacitance may be stored in a storage unit 136 provided in the controller 135.

Next, as described in step S208, it is determined whether a change of a position of the finger 200 when the finger 200 is moved away is in a predetermined direction and whether a value of the length L2, which is a change of a position of the finger 200 when the finger 200 is moved away, per a length LH in which the finger 200 is moved in close proximity is greater than or equal to a predetermined value. Specifically, the moving direction Xa2 of the finger 200 in the X direction and the length L2 between the position P3 and the position P4 are calculated by the position P3 in which the capacitance is last greater than or equal to the second threshold Ct2 and the position P4 in which the capacitance is last greater than or equal to the first threshold Ct1, and the length LH between the position P2 and the position P3 is calculated by the position P2 that is a position in the X direction where the second threshold Ct2 is detected and the position P3 that is a position in the X direction where the second threshold Ct2 is detected last, and it is determined whether the moving direction Xa2 of the finger 200 in the X direction is the +X direction and the length L2 is longer than or equal to a predetermined length. It is determined whether the moving direction Xa2 of the finger 200 in the X direction is the +X direction and a ratio of the length L2 to the length LH is greater than or equal to a predetermined value. When the moving direction Xa2 of the finger 200 in the X direction is the +X direction and a ratio of the length L2 to the length LH is greater than or equal to a predetermined value, the flow proceeds to step S210, and when a ratio of the length L2 to the length LH is not greater than or equal to a predetermined value, the flow proceeds to step S202.

Next, as described in step S210, it is determined whether the duration (i.e., the detection duration $\Delta T$) in which the detected capacitance is greater than or equal to the first threshold Ct1 is shorter than or equal to a predetermined time length. Specifically, in a case illustrated in FIG. 12, the detection duration $\Delta T$ in which a value of the measured capacitance is greater than or equal to the first threshold Ct1 is calculated by $\Delta T = T9 - T1$ where the time T1 is time when a value of the measured capacitance first becomes greater than or equal to the first threshold Ct1 and where the time T9 is time when a value of the measured capacitance is last greater than or equal to the first threshold Ct1, and it is determined whether the detection duration $\Delta T$ is shorter than or equal to a predetermined time length. When the detection duration $\Delta T$ is shorter than or equal to the predetermined time length, the flow proceeds to step S212, and when the detection duration $\Delta T$ is not shorter than or equal to the predetermined time length, the flow proceeds to step S202. The predetermined time length is 500 milliseconds for example, and in the embodiment, the predetermined time length may be described as a first time length.

Next, as described in step S212, it is determined whether a direction in the X direction in which the finger 200 is moved closer to the operation input device is the same as a direction in the X direction in which the finger 200 is moved away from the operation input device. Specifically, the moving direction Xa1 of the finger 200 in the X direction is obtained by the position P1 in which a value of the measured capacitance first becomes greater than or equal to the first threshold Ct1 and the position P2 in which subsequently a value of the measured capacitance becomes greater than or equal to the second threshold Ct2. Additionally, the moving direction Xa2 of the finger 200 in the X direction is obtained by the position P3 in which a value of the measured capacitance is last greater than or equal to the second threshold Ct2 and the position P4 in which a value of the measured capacitance is last greater than or equal to the first threshold Ct1 later. When the moving direction Xa1 and the moving direction Xa2 are in the same direction and both are in the +X direction, the flow proceeds to step S214. When the moving direction Xa1 and the moving direction Xa2 are not in the same direction or both are not in the +X direction, the flow proceeds to step S202.

Next, as described in step S214, in the controller 135 or the like, an operation by the finger 200 is recognized as a gesture operation. This can open a door to which a door handle including the operation input device inside is attached.

By the steps above, an operation input can be performed using the operation input device. The embodiment may be a combination of the third operation input method illustrated in FIG. 10 and the fourth operation input method illustrated in FIG. 11.

Specifically, step S208 illustrated in FIG. 11 may be added between step S206 and step S210 in the flowchart illustrated in FIG. 10.

It should be noted that contents other than the contents described above are similar to the first embodiment.

Third Embodiment

Figure 13:
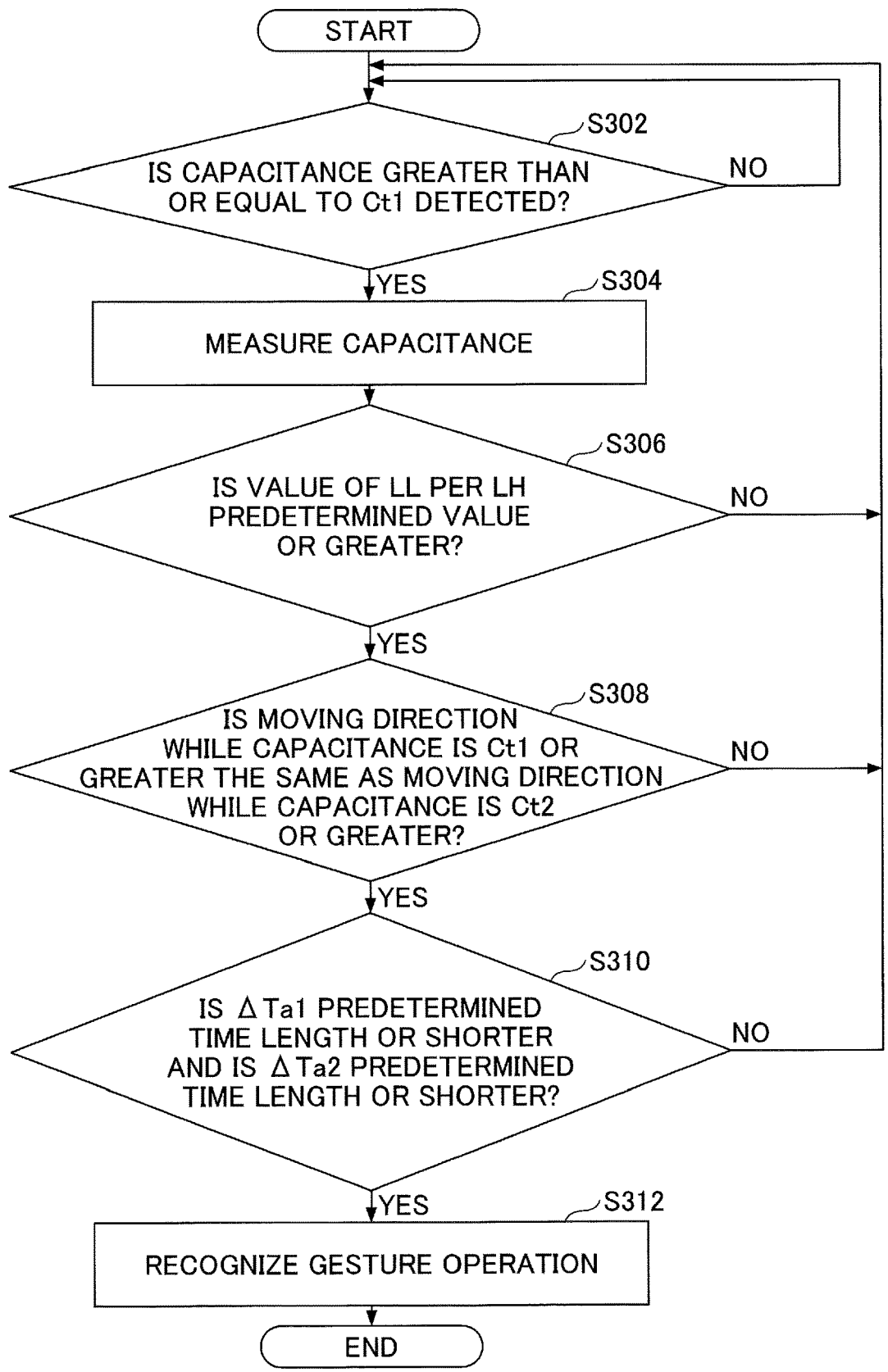
FIG. 13 is a flowchart of an operation input method in a third embodiment.

Next, a third embodiment will be described. This embodiment is an operation input method using the operation input device included inside a door handle illustrated in FIG. 2 and other drawings. The operation input method in the embodiment will be described based on FIG. 13. FIG. 13 is a flowchart of a detection method that detects a gesture operation of moving the finger 200 in the +X direction, moving the finger 200 closer to the operation input device at first, and moving the finger 200 away from the operation input device later.

(Fifth Operation Input Method)

Figure 14:
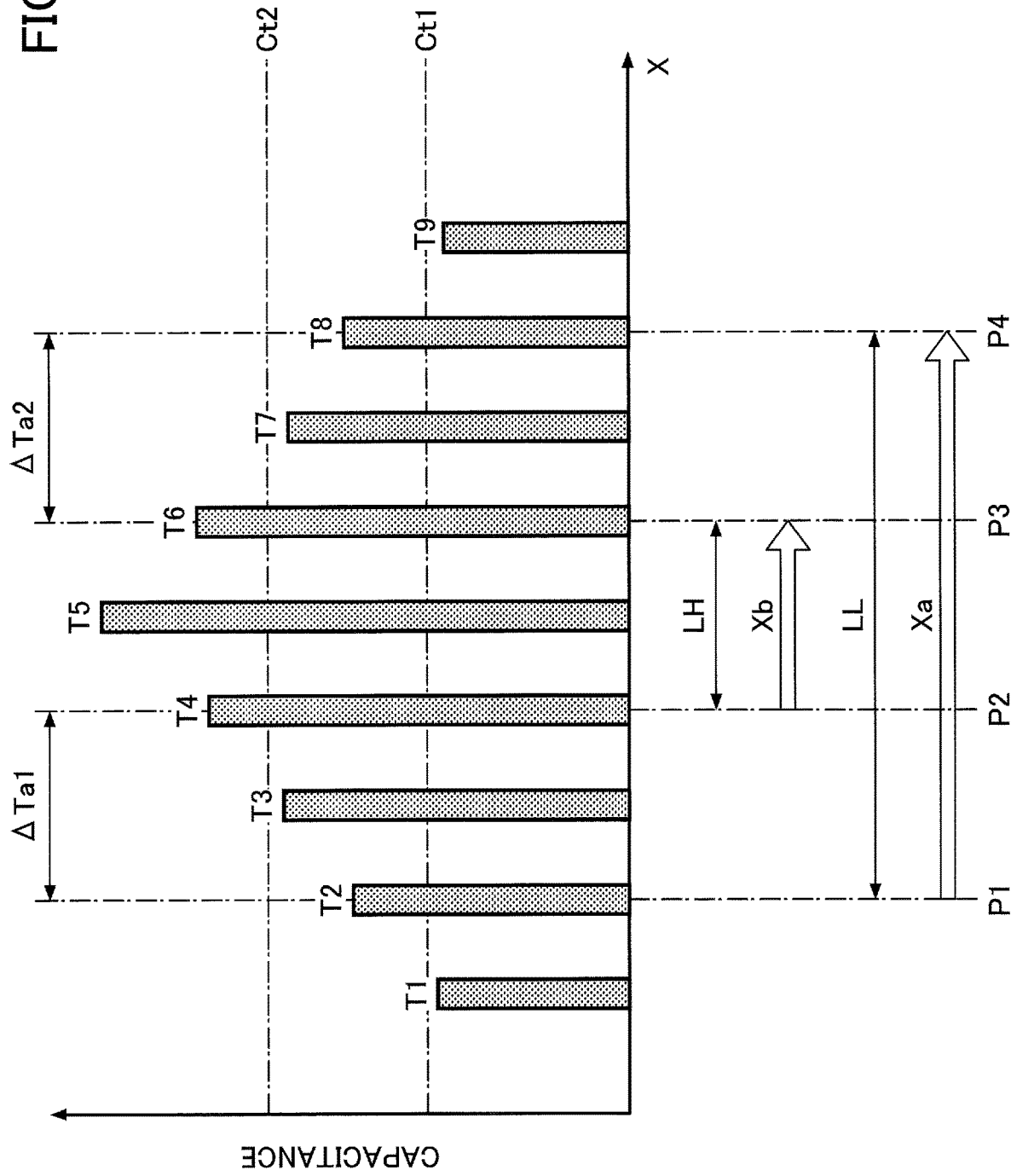
FIG. 14 is an explanatory drawing of an operation input method in a third embodiment.

FIG. 13 is a flowchart that detects a gesture operation, as illustrated in FIG. 4, of moving the finger 200 from one end 110a toward the other end 110b of the substrate 110, moving the finger 200 closer to the substrate 110, and moving the finger 200 away from the substrate 110. In the embodiment, as illustrated in FIG. 14, a gesture operation by the finger 200 is detected by setting the first threshold Ct1 and the second threshold Ct2 that is greater than the first threshold Ct1 for the detected capacitance. In the embodiment, the following description assumes that a position in the X direction where the first threshold Ct1 is detected first is P1, a position in the X direction where subsequently the second threshold Ct2 is detected is P2, a position in the X direction where the second threshold Ct2 is detected last is P3, and a position in the X direction where the first threshold Ct1 is detected last is P4. Here, FIG. 14 illustrates a position of the electrode and a value of the capacitance at a peak of a distribution of the capacitance detected by the detecting electrodes at each time.

First, as described in step S302, in the operation input device, it is determined whether the capacitance greater than or equal to the first threshold Ct1 is detected. When the capacitance greater than or equal to the first threshold Ct1 is detected, the flow proceeds to step S304. When the capacitance greater than or equal to the first threshold Ct1 is not detected, the flow repeats step S302.

Next, as described in step S304, a gesture determination is performed by measuring the capacitance in the operation input device of the embodiment. A value of the measured capacitance may be stored in a storage unit 136 provided in the controller 135. For example, a measurement of the capacitance is performed every 1 millisecond. Here, when a duration from when a value of the measured capacitance first becomes greater than or equal to the first threshold Ct1 to when a value of the measured capacitance becomes smaller than the first threshold Ct1 is longer than a predetermined time length, it is determined that there is no gesture and the flow may proceed to step S302. Additionally, when the capacitance does not become greater than or equal to the second threshold Ct2 even after a lapse of another predetermined time length after the capacitance first becomes greater than or equal to the first threshold Ct1, it may be determined that there is no gesture and the flow may proceed to step S302.

Next, as described in step S306, it is determined whether a value of the length LL while the capacitance is greater than or equal to the first threshold Ct1, per the length LH while the capacitance is greater than or equal to the second threshold Ct2, is greater than or equal to a predetermined value.

Specifically, the length LL that is a length in which the finger 200 is moved in the X direction is calculated by the position P1 in which the capacitance first becomes greater than or equal to the first threshold Ct1 and the position P4 in which the capacitance is last greater than or equal to the first threshold Ct1, and the length LH that is a length in which the finger 200 is moved in the X direction is calculated by the position P2 in which the capacitance first becomes greater than or equal to the second threshold Ct2 and the position P3 in which the capacitance is last greater than or equal to the second threshold Ct2, and it is determined whether a value of the length LL per the length LH is greater than or equal to a predetermined value. When a value of the length LL per the length LH is greater than or equal to the predetermined value, the flow proceeds to step S308, and when a value of the length LL per the length LH is not greater than or equal to the predetermined value, the flow proceeds to step S302.

Next, as described in step S308, it is determined whether a moving direction Xb of the finger 200 in the X direction from when the capacitance first becomes greater than or equal to the second threshold Ct2 to when the capacitance is last greater than or equal to the second threshold Ct2 is equal to a moving direction Xa of the finger 200 in the X direction from when the capacitance first becomes greater than or equal to the first threshold Ct1 to when the capacitance is last greater than or equal to the first threshold Ct1. Specifically, the moving direction Xa of the finger 200 in the X direction is obtained by the position P1 in which the capacitance first becomes greater than or equal to the first threshold Ct1 and the position P4 in which the capacitance is last greater than or equal to the first threshold Ct1, and the moving direction Xb of the finger 200 in the X direction is obtained by the position P2 in which the capacitance first becomes greater than or equal to the second threshold Ct2 and the position P3 in which the capacitance is last greater than or equal to the second threshold Ct2, and it is determined whether the moving directions Xa and Xb of the finger 200 in the X direction are in the same direction and in the +X direction. When the moving directions Xa and Xb of the finger 200 in the X direction are in the same direction and in the +X direction, the flow proceeds to step S310, and when the moving directions Xa and Xb of the finger 200 in the X direction are not in the same direction or are not in the +X direction, the flow proceeds to step S302.

Next, as described in step S310, it is determined whether a duration (i.e., a detection duration $\Delta$Ta1) from when the detected capacitance first becomes greater than or equal to the first threshold Ct1 to when the detected capacitance becomes greater than or equal to the second threshold Ct2 is shorter than or equal to a predetermined time length, and a duration (i.e., a detection duration $\Delta$Ta2) from when the detected capacitance is last greater than or equal to the second threshold Ct2 to when the detected capacitance becomes greater than or equal to the first threshold Ct1 is shorter than or equal to a predetermined time length. Specifically, in a case illustrated in FIG. 14, the detection duration $\Delta$Ta1 is calculated by $\Delta$Ta1=T4−T2 where the time T2 is time when a value of the measured capacitance first becomes greater than or equal to the first threshold Ct1 and where the time T4 is time when a value of the measured capacitance first becomes greater than or equal to the second threshold Ct2, and the detection duration $\Delta$Ta2 is calculated by $\Delta$Ta2=T8−T6 where the time T6 is time when a value of the measured capacitance is last greater than or equal to the second threshold Ct2 and where the time T8 is time when a value of the measured capacitance is last greater than or equal to the first threshold Ct1, and it is determined whether the detection duration $\Delta$Ta1 is shorter than or equal to a predetermined time length and the detection duration $\Delta$Ta2 is shorter than or equal to a predetermined time length. When the detection duration $\Delta$Ta1 is shorter than or equal to a predetermined time length and the detection duration $\Delta$Ta2 is shorter than or equal to a predetermined time length, the flow proceeds to step S312, and when the detection duration $\Delta$Ta1 is not shorter than or equal to a predetermined time length or the detection duration $\Delta$Ta2 is not shorter than or equal to a predetermined time length, the flow proceeds to step S302.

Next, as described in step S312, in the controller 135 or the like, an operation by the finger 200 is recognized as a gesture operation. This can open a door to which a door handle including the operation input device inside is attached.

By the steps above, an operation input can be performed using the operation input device. Here, in the description above, for convenience of description, a case in which the capacitance is collectively measured in step S304 is described. However, the method is not limited to this.

It should be noted that contents other than the contents described above are similar to the first embodiment.

Fourth Embodiment

Next, a fourth embodiment will be described based on FIG. 15. This embodiment is an embodiment in another view of the first to third embodiments, and a part of contents is overlapped. Here, FIG. 15 illustrates a position of the electrode and a value of the capacitance at a peak of a distribution of the capacitance detected by the detecting electrodes at each time. A peak position Pa1 is a peak position of the capacitance at the time T1, a peak position Pat is a peak position of the capacitance at the time T2, a peak position Pa3 is a peak position of the capacitance at the time T3, a peak position Pa4 is a peak position of the capacitance at the time T4, a peak position Pa5 is a peak position of the capacitance at the time T5, a peak position Pa6 is a peak position of the capacitance at the time T6, a peak position Pa1 is a peak position of the capacitance at the time T7, a peak position Pa8 is a peak position of the capacitance at the time T8, a peak position Pa9 is a peak position of the capacitance at the time T9, and a peak position Pa10 is a peak position of the capacitance at the time T10.

In the embodiment, it may be determined that a gesture operation is performed when, within a predetermined time length $\Delta$Ts after the detected capacitance first becomes greater than or equal to the first threshold Ct1, a length in which a peak position of the detected capacitance is moved is longer than or equal to a predetermined length. Specifically, when the predetermined time length $\Delta$Ts is T4−T1, it may be determined whether a distance $\Delta$Ps from a peak position Pa1 of the capacitance at the time T1 to a peak position Pa4 of the capacitance at the time T4 is longer than or equal to a predetermined length.

Additionally, it may be determined that a gesture operation is performed when, within a predetermined time length $\Delta$Ts after the detected capacitance first becomes greater than or equal to the first threshold Ct1, a peak value of the detected capacitance is greater than or equal to the second threshold Ct2. Specifically, when the predetermined time length $\Delta$Ts is T4−T1, it may be determined whether a peak value of the capacitance at the time T4 is greater than or equal to the second threshold Ct2.

Furthermore, it may be determined that a gesture operation is performed when, within the predetermined time length $\Delta$Ts, a peak or a center of gravity coordinate of the detected capacitance is continuously moved in a predetermined direction such as in the +X direction. Specifically, it may be determined whether a peak position is continuously moved in the +X direction from the peak position Pa1 of the capacitance at the time T1, the peak position Pa2 of the capacitance at the time T2, the peak position Pa3 of the capacitance at the time T3, to the peak position Pa4 of the capacitance at the time T4.

Additionally, it may be determined that a gesture operation is performed when, within the predetermined time length $\Delta$Ts, the detected capacitance is continuously increased or is continuously decreased. Specifically, it may be determined whether a peak value of the capacitance at the time T1, a peak value of the capacitance at the time T2, a peak value of the capacitance at the time T3, and a peak value of the capacitance at the time T4 are continuously increased. Similarly, when the predetermined time length $\Delta$Ts is T9−T6, it may be determined whether a peak value of the capacitance at the time T6, a peak value of the capacitance at the time T7, a peak value of the capacitance at the time T8, and a peak value of the capacitance at the time T9 are continuously decreased.

Furthermore, it may be determined that a gesture operation is performed when, within another predetermined time length $\Delta$Tp1 after the detected capacitance first becomes greater than or equal to the first threshold Ct1, a value of the capacitance becomes smaller than the first threshold Ct1. Specifically, when the predetermined time length $\Delta$Tp1 is T10−T1, it may be determined whether a value of the capacitance at the time T10 is smaller than the first threshold Ct1. Additionally, it may be determined that a gesture operation is performed when, within a predetermined time length ΔTp2 after the detected capacitance first becomes greater than or equal to the second threshold Ct2, a value of the capacitance becomes smaller than the first threshold Ct1. Specifically, when the predetermined time length ΔTp2 is T10–T3, it may be determined whether a value of the capacitance at the time T10 is smaller than the first threshold Ct1. Here, in a good measurement environment with low noise, determination may be made only by conditions corresponding to steps S106 and S108.

In the embodiments, it may be determined that a gesture operation is performed when multiple conditions of the conditions described above are satisfied. Furthermore, it may be determined that a gesture operation is performed when all conditions of the conditions described above are satisfied. In this case, it can be strictly determined whether a gesture operation is performed.

The embodiments have been described in detail above, but are not limited to a specific embodiment. The various modifications and alterations can be made within the scope described in the claim.

What is claimed is:

1. An operation input device comprising:
a substrate formed of an insulator;
a plurality of detecting electrodes provided on a surface of the substrate; and
an integrated circuit,
wherein the integrated circuit detects capacitance generated between each of the plurality of detecting electrodes and an operation body when the operation body is positioned in proximity to the substrate, and determines that a gesture operation, by the operation body, is performed when a duration from when the capacitance becomes greater than or equal to a first threshold to when the capacitance becomes greater than or equal to a second threshold is greater than or equal to a predetermined value, or when a length in which the operation body is moved from when the capacitance becomes greater than or equal to the first threshold to when the capacitance becomes greater than or equal to the second threshold is greater than or equal to a predetermined value, the first threshold being a threshold for the capacitance, and the second threshold being greater than the first threshold.

2. An operation input device comprising:
a substrate formed of an insulator;
a plurality of detecting electrodes provided on a surface of the substrate; and
an integrated circuit,
wherein the integrated circuit detects capacitance generated between each of the plurality of detecting electrodes and an operation body when the operation body is positioned in proximity to the substrate, and determines that a gesture operation, by the operation body, is performed when a duration from when the capacitance is at least greater than or equal to a second threshold to when the capacitance is at least greater than or equal to a first threshold is greater than or equal to a predetermined value, or when a length in which the operation body is moved from when the capacitance is at least greater than or equal to the second threshold to when the capacitance is at least greater than or equal to the first threshold is greater than or equal to a predetermined value, the first threshold being a threshold for the capacitance, and the second threshold being greater than the first threshold.

3. An operation input device comprising:
a substrate formed of an insulator;
a plurality of detecting electrodes provided on a surface of the substrate; and
an integrated circuit,
wherein the integrated circuit detects capacitance generated between each of the plurality of detecting electrodes and an operation body when the operation body is positioned in proximity to the substrate, and determines that a gesture operation, by the operation body, is performed when the capacitance becomes greater than or equal to a first threshold, the capacitance subsequently becomes greater than or equal to a second threshold, and further the capacitance becomes smaller than the second threshold and greater than or equal to the first threshold, the first threshold being a threshold for the capacitance, and the second threshold being greater than the first threshold, and
wherein the operation input device determines that the gesture operation, by the operation body, is performed when a duration from when the capacitance first becomes greater than or equal to the second threshold to when the capacitance is at least greater than or equal to the second threshold is shorter than a predetermined time length.

4. The operation input device as claimed in claim 1, wherein the operation input device determines that the gesture operation, by the operation body, is performed when a duration from when the capacitance first becomes greater than or equal to the second threshold to when the capacitance is at least greater than or equal to the second threshold is shorter than a predetermined time length.

5. The operation input device as claimed in claim 2, wherein the operation input device determines that the gesture operation, by the operation body, is performed when a duration from when the capacitance first becomes greater than or equal to the second threshold to when the capacitance is at least greater than or equal to the second threshold is shorter than a predetermined time length.

6. The operation input device as claimed in claim 1, wherein the operation input device determines that the gesture operation by the operation body, is performed when a moving direction of the operation body based on the capacitance detected by the plurality of detecting electrodes is a same direction in a range in which the capacitance is greater than or equal to the first threshold.

7. The operation input device as claimed in claim 2, wherein the operation input device determines that the gesture operation, by the operation body, is performed when a moving direction of the operation body based on the capacitance detected by the plurality of detecting electrodes is a same direction in a range in which the capacitance is greater than or equal to the first threshold.

8. The operation input device as claimed in claim 3, wherein the operation input device determines that the gesture operation, by the operation body, is performed when a moving direction of the operation body based on the capacitance detected by the plurality of detecting electrodes is a same direction in a range in which the capacitance is greater than or equal to the first threshold.

9. The operation input device as claimed in claim 1, wherein the plurality of detecting electrodes are arranged along a longitudinal direction of the substrate.

10. The operation input device as claimed in claim 2, wherein the plurality of detecting electrodes are arranged along a longitudinal direction of the substrate.

11. The operation input device as claimed in claim 3, wherein the plurality of detecting electrodes are arranged along a longitudinal direction of the substrate.

12. A door handle comprising the operation input device as claimed in claim 1.

13. A door handle comprising, the operation input device as claimed in claim 2.

14. A door handle comprising the operation input device as claimed in claim 3.

15. The door handle as claimed in claim 12, the door handle being controlled by the gesture operation by the operation body.

16. The door handle as claimed in claim 13, the door handle being controlled by the gesture operation by the operation body.

17. The door handle as claimed in claim 14, the door handle being controlled by the gesture operation by the operation body.

\* \* \* \* \*